US012739485B2

(12) United States Patent
Suzuki

(10) Patent No.: US 12,739,485 B2
(45) Date of Patent: Sep. 15, 2026

(54) IMAGING APPARATUS

(71) Applicant: CANON KABUSHIKI KAISHA, Tokyo (JP)

(72) Inventor: Yuto Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 18/912,233

(22) Filed: Oct. 10, 2024

(65) Prior Publication Data

US 2025/0126335 A1 Apr. 17, 2025

(30) Foreign Application Priority Data

Oct. 17, 2023 (JP) ................................ 2023-178799

(51) Int. Cl.
*H04N 23/52* (2023.01)
*H04N 23/54* (2023.01)
*H05K 7/20* (2006.01)

(52) U.S. Cl.
CPC ............. *H04N 23/52* (2023.01); *H04N 23/54* (2023.01); *H05K 7/20145* (2013.01)

(58) Field of Classification Search
CPC ..... H04N 23/52; H04N 23/54; H05K 7/20145
See application file for complete search history.

(56) References Cited

U.S. PATENT DOCUMENTS

2017/0346996 A1* 11/2017 Kida ...................... H04N 23/51
2020/0120250 A1* 4/2020 Colin ................ H05K 7/20145
2021/0232024 A1* 7/2021 Endo ...................... H04N 23/54
2022/0294956 A1* 9/2022 Tamura .................. H04N 23/53
2022/0303444 A1* 9/2022 Urashima ............. H04N 23/51
2023/0179847 A1* 6/2023 Suzuki .................. H04N 23/51
348/208.7

FOREIGN PATENT DOCUMENTS

JP 2022139640 A 9/2022

* cited by examiner

*Primary Examiner* — Amy R Hsu
(74) *Attorney, Agent, or Firm* — Canon U.S.A., Inc., IP Division

(57) ABSTRACT

An imaging apparatus includes an imaging sensor configured to capture an image, an imaging substrate on which the imaging sensor is mounted, a control substrate on which an electronic element configured to perform imaging processing of the imaging sensor is mounted, and a cooling unit, wherein the cooling unit includes a duct thermally connected to the imaging substrate and the control substrate, and a fan thermally connected to the duct and configured to generate air flow for cooling the imaging substrate and the control substrate, and wherein the imaging substrate, the control substrate, and the cooling unit are placed along an optical axis direction of the imaging sensor, without overlapping each other.

13 Claims, 10 Drawing Sheets

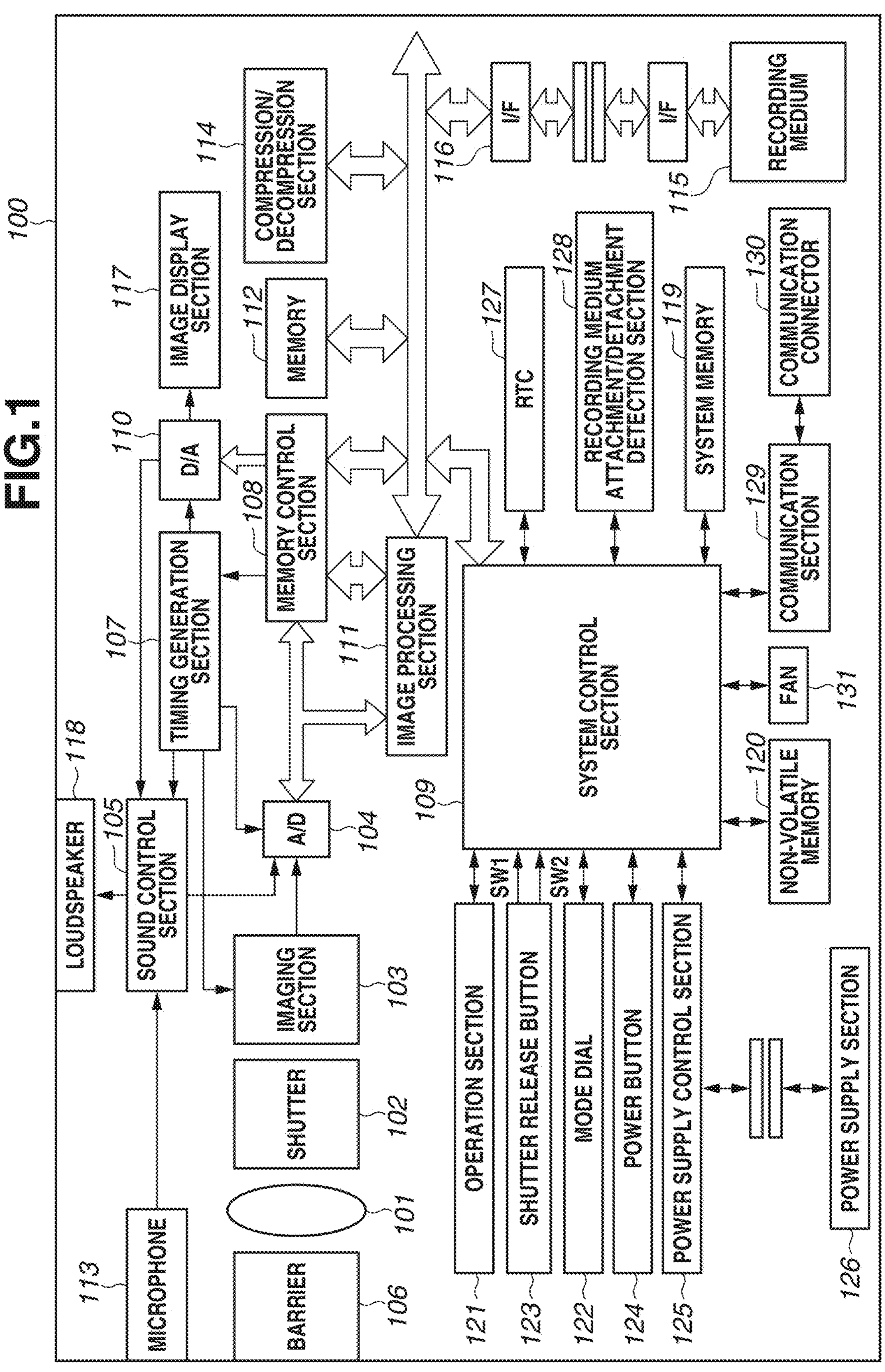
FIG.1
100
MICROPHONE
113
BARRIER
106
101
SHUTTER
102
IMAGING SECTION
103
SOUND CONTROL SECTION
105
LOUDSPEAKER
118
A/D
104
TIMING GENERATION SECTION
107
D/A
110
IMAGE DISPLAY SECTION
117
MEMORY CONTROL SECTION
108
MEMORY
112
COMPRESSION/ DECOMPRESSION SECTION
114
IMAGE PROCESSING SECTION
111
I/F
116
I/F
RECORDING MEDIUM
115
SYSTEM CONTROL SECTION
109
RTC
127
RECORDING MEDIUM ATTACHMENT/DETACHMENT DETECTION SECTION
128
SYSTEM MEMORY
119
COMMUNICATION CONNECTOR
130
COMMUNICATION SECTION
129
FAN
131
NON-VOLATILE MEMORY
120
SW1
SW2
OPERATION SECTION
121
SHUTTER RELEASE BUTTON
123
MODE DIAL
122
POWER BUTTON
124
POWER SUPPLY CONTROL SECTION
125
POWER SUPPLY SECTION
126

100
201
212
O
304
309
Z(O)
Y
X
209
123
124
204
307
302
109
313
202b
113
122
301
305
312
202
314
131
310
303
311
701
117
203
214

109
302
201
307
301
305
403
131
310
401
402
303
Y
X
Z(O)

303
310 131
305
302
P
Y
X
Z(O)

303
310 131
P
305
302
Y
Z(O)
X 303
305
310 131
302
P
Y
X
Z(O)

303
131 310
302
P
305
Y
X
Z(O)

302
312
311
314
S
131
310
303
311b
402
R
305
311a
701
Q
Y
X
Z(O)

FIG.9
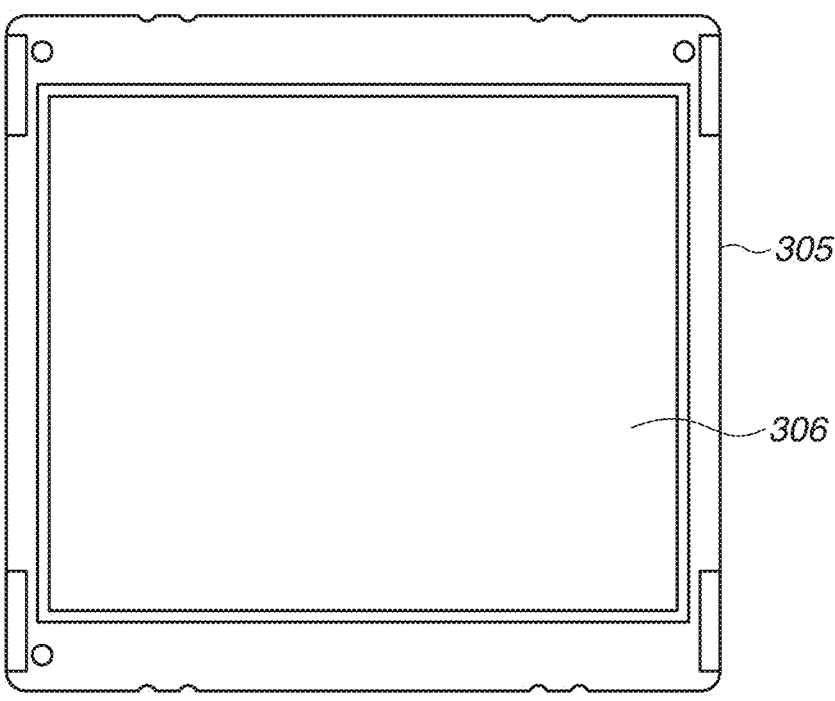
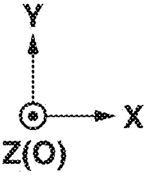

IMAGING APPARATUS

BACKGROUND

Field

The present disclosure relates to an imaging apparatus having a heat dissipation structure.

Description of the Related Art

In recent years, with a demand for the miniaturization of an imaging apparatus, the miniaturization and the heightened density of electronic components inside the apparatus are remarkable.

On the other hand, a demand for the enhanced function of the imaging apparatus, particularly the enhanced performance of a moving image function, becomes stronger and stronger, and the amount of heat generated by the imaging apparatus tends to increase.

As a result, there is a high possibility that the temperature inside the apparatus rises when a moving image is captured, and this causes an erroneous operation of an electronic component, a decrease in performance, or the breakdown of the imaging apparatus.

In recent years, there is a case where the amount of heat dissipated by a heat dissipation structure based on natural heat dissipation is insufficient for the amount of heat generated by an imaging apparatus, and a heat dissipation structure based on forced air cooling using a fan is used.

Japanese Patent Application Laid-Open No. 2022-139640 discusses an imaging apparatus including a heat dissipation structure based on a fan and a duct.

The imaging apparatus in Japanese Patent Application Laid-Open No. 2022-139640 includes a duct in which vents are formed on the back surface and upper surface sides and the bottom surface side of an exterior member.

The duct is formed to extend from the back surface side to the front surface side of the imaging apparatus in the optical axis direction of the imaging apparatus, further extends from the upper surface side to the bottom surface side of the imaging apparatus, passes through a region between a control circuit substrate and the exterior member, and is connected to the vent on the bottom surface side.

A fan is placed inside on the bottom surface side of the duct.

Heat generated in the control circuit substrate is transmitted to the duct and exhausted using air flow generated in the duct by the fan, whereby it is possible to exhaust the heat of the control circuit substrate to outside the imaging apparatus.

SUMMARY

According to an aspect of the present disclosure, an imaging apparatus includes an imaging sensor configured to capture an image, an imaging substrate on which the imaging sensor is mounted, a control substrate on which an electronic element configured to perform imaging processing of the imaging sensor is mounted, and a cooling unit, wherein the cooling unit includes a duct thermally connected to the imaging substrate and the control substrate, and a fan thermally connected to the duct and configured to generate air flow for cooling the imaging substrate and the control substrate, and wherein the imaging substrate, the control substrate, and the cooling unit are placed along an optical axis direction of the imaging sensor, without overlapping each other.

Further features of the present disclosure will become apparent from the following description of exemplary embodiments with reference to the attached drawings.

BRIEF DESCRIPTION OF THE DRAWINGS

FIG. 1 is a block diagram illustrating a configuration of a digital camera according to an embodiment.

FIG. 9 is an external view of an imaging substrate that is a component of the digital camera according to the present disclosure.

DESCRIPTION OF THE EMBODIMENTS

Figure 2A:
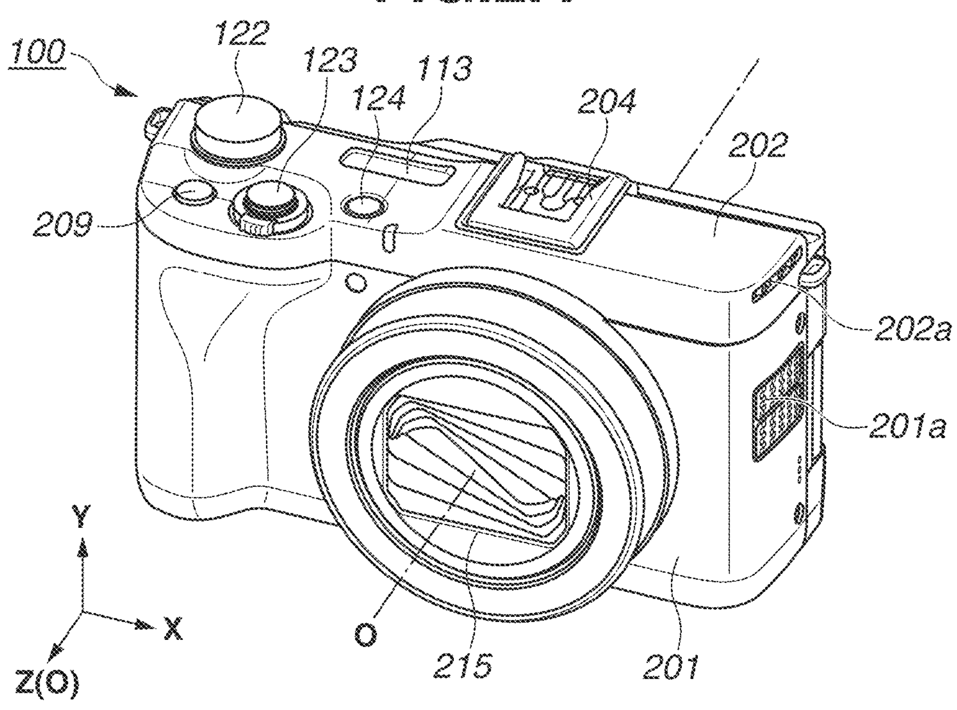
FIGS. 2A and 2B are external perspective views of the digital camera according to an embodiment.

In an imaging apparatus discussed in the Japanese Patent Application Laid-Open No. 2022-139640, a duct is placed between a control circuit substrate and an exterior member, whereby the imaging apparatus becomes large by an amount corresponding to the size of the duct. This contradicts a demand for the miniaturization of an imaging apparatus in recent years.

The present disclosure is directed to providing an imaging apparatus capable of preventing a camera from becoming large while a cooling unit composed of a fan and a duct is provided in the imaging apparatus.

Exemplary embodiments of the present disclosure will be described below with reference to the drawings.

(Configuration of Digital Camera 100)

FIG. 1 is a block diagram illustrating an example of the configuration of a digital camera 100 as an example of an imaging apparatus according to the present disclosure.

In a first exemplary embodiment, a digital camera is illustrated as an example of the imaging apparatus. The present disclosure, however, is not so limited.

An optical system of the digital camera 100 includes an imaging lens 101, a shutter 102 having a diaphragm function, and an imaging section 103.

The imaging section 103 includes an imaging sensor 306, an imaging substrate 305 that transmits a converted electric signal, and an imaging flexible substrate 307.

The details of the imaging section 103 will be described below.

An analog-to-digital (A/D) conversion section 104 is used to convert an analog signal output from the imaging section 103 into a digital signal and is used to convert an analog signal output from a sound control section 105 into a digital signal.

A lens barrier 106 covers the imaging lens 101 of the digital camera 100, thereby reducing the dirt and the breakage of the imaging lens 101 and the digital camera 100.

A timing generation section 107 is controlled by a memory control section 108 and a system control section 109 and supplies a clock signal and a control signal to the imaging section 103, the sound control section 105, the A/D conversion section 104, and a digital-to-analog (D/A) conversion section 110.

An image processing section 111 performs predetermined processes including a resizing process such as pixel interpolation and reduction and a color conversion process on output data from the A/D conversion section 104 and data stored in a memory 112.

The image processing section 111 performs a predetermined calculation on captured image data. The system control section 109 performs exposure control and distance measurement control based on the obtained calculation result.

Consequently, an autofocus (AF) process, an automatic exposure (AE) process, and a pre-flash (EF) process are performed by a through-the-lens (TTL) method.

Further, the image processing section 111 also performs a predetermined calculation process using captured image data and performs an auto white balance (AWB) process by the TTL method based on the obtained calculation result.

Output data from the A/D conversion section 104 is written to the memory 112 via the image processing section 111 and the memory control section 108 or directly via the memory control section 108.

The memory 112 stores information accompanying an image, such as a file header in a case where sound data recorded using a microphone 113, a captured still image or moving image, or an image file is configured.

The memory 112 includes a sufficient storage capacity for storing a predetermined number of still images and a moving image and a sound of a predetermined length of time.

A compression/decompression section 114 compresses and decompresses image data by adaptive discrete cosine transform (ADCT). The compression/decompression section 114 reads a captured image stored in the memory 112 using the shutter 102 as a trigger, performs a compression process on the captured image, and writes data obtained by the process to the memory 112.

The compression/decompression section 114 also reads a compressed image loaded from a recording medium 115 into the memory 112, performs a decompression process on the compressed image, and writes data obtained by the process to the memory 112.

Image data written to the memory 112 by the compression/decompression section 114 is converted into a file by a file processing section of the system control section 109 and recorded in the recording medium 115 via a recording medium interface (I/F) 116.

The memory 112 doubles as a memory for image display. Image data for display written in the memory 112 is displayed on an image display section 117 via the D/A conversion section 110.

A sound signal output from the microphone 113 is converted into a digital signal by the A/D conversion section 104 via the sound control section 105 composed of an amplifier, and then, the digital signal is stored in the memory 112 by the memory control section 108.

On the other hand, sound data recorded in the recording medium 115 is loaded into the memory 112, and then, a signal obtained by the sound control section 105 processing the sound data via the D/A conversion section 110 is emitted from a loudspeaker 118.

The system control section 109 is a control method capable of performing overall control of the digital camera 100 and components attached to the digital camera 100.

To the system control section 109, a non-volatile memory 120 and a system memory 119 are connected.

The non-volatile memory 120 is a non-volatile recording element. In the non-volatile memory 120, a program for causing the system control section 109 to operate and various adjustment parameters are recorded.

The program read from the non-volatile memory 120 is loaded into the system memory 119 that is a volatile recording element and executed.

The system memory 119 is a so-called frame memory and is a storage section which can temporarily accumulate an image signal and from which the image signal can be read when needed.

The system memory 119 can store a constant and a variable for the operation of the system control section 109 and a program.

A shutter switch (SW1), a shutter switch (SW2), and an operation section 121 are an operation method for a user to input various operation instructions to the system control section 109.

The operation section 121 includes various operation members such as a menu button and a jog dial. The operation section 121 can display a captured image on the image display section 117 and enable the user to make various settings.

If a menu button is pressed, a menu screen where various settings can be made is displayed on the image display section 117.

The user can intuitively make various settings using the menu screen displayed on the image display section 117 and the operation section 121.

The operation section 121 may detect contact of a finger of the user or a pen with the image display section 117 and determine an icon displayed on the image display section 117 similarly to an operation on a switch such as a button or a dial.

Further, through the use of an operation member capable of detecting the rotation of a jog dial, the user may perform an operation similar to that on a bidirectional key.

A mode dial 122 is used by the user to switch the operation mode of the system control section 109 to a still image capturing mode, a continuous imaging mode, a moving image mode, and a reproduction mode.

The shutter switch (SW1) is turned on in an intermediate state of an operation (a half press) on a shutter release button 123 provided in the digital camera 100.

Then, the shutter switch (SW1) gives an instruction to start an operation such as an AF process, an AE process, an AWB process, or an EF process.

The shutter switch (SW2) is turned on by the completion of an operation (a full press) on the shutter release button 123 and gives an instruction to start a series of operations of an imaging process from the reading of a signal from the imaging section 103 to the writing of image data to the recording medium 115.

A power button 124 is an operation member for switching the turning on and off of the digital camera 100.

A power supply control section 125 includes a battery detection circuit, a direct-current-to-direct-current (DC/DC) converter, and a switch circuit for switching blocks to which to apply a current. The power supply control section 125 detects the presence or absence of attachment of a battery, the type of the battery, and the remaining life of the battery.

The power supply control section 125 also controls the DC/DC converter based on the detection results and an instruction from the system control section 109 and supplies required voltages to electric elements including the system control section 109 for a required period.

A power supply section 126 includes a primary battery such as an alkaline battery or a lithium battery, a secondary battery such as a nickel-cadmium (NiCd) battery, a nickel-metal hydrate (NiMH) battery, or a lithium-ion (Li) battery, or an alternating current (AC) adapter.

The power supply section 126 is connected to the power supply control section 125 by a camera-side power supply connector.

A real-time clock (RTC) 127 holds a power supply section inside separately from the power supply control section 125 and continues to measure time even in the state where the power supply section 126 is turned off.

The system control section 109 controls a timer using the date and time acquired by the RTC 127 when the system control section 109 starts.

A recording medium attachment/detachment detection section 128 detects whether the recording medium 115 is attached to the digital camera 100.

A communication section 129 performs various communication processes using Recommended Standard (RS) 232C, Universal Serial Bus (USB), the Institute of Electrical and Electronics Engineers (IEEE) 1394, P1284, Small Computer System Interface (SCSI), a modem, a local area network (LAN), and wireless communication.

A communication connector 130 (an antenna in the case of wireless communication) connects the digital camera 100 to another device via the communication section 129.

The driving (the rotation and stop and the number of rotations) of a fan 131 is controlled by the system control section 109.

The details of the fan 131 will be described below.

(External Appearance of Digital Camera 100)

FIG. 2A is a perspective view of the digital camera 100 when viewed from its front surface side (an object side).

Figure 2B:
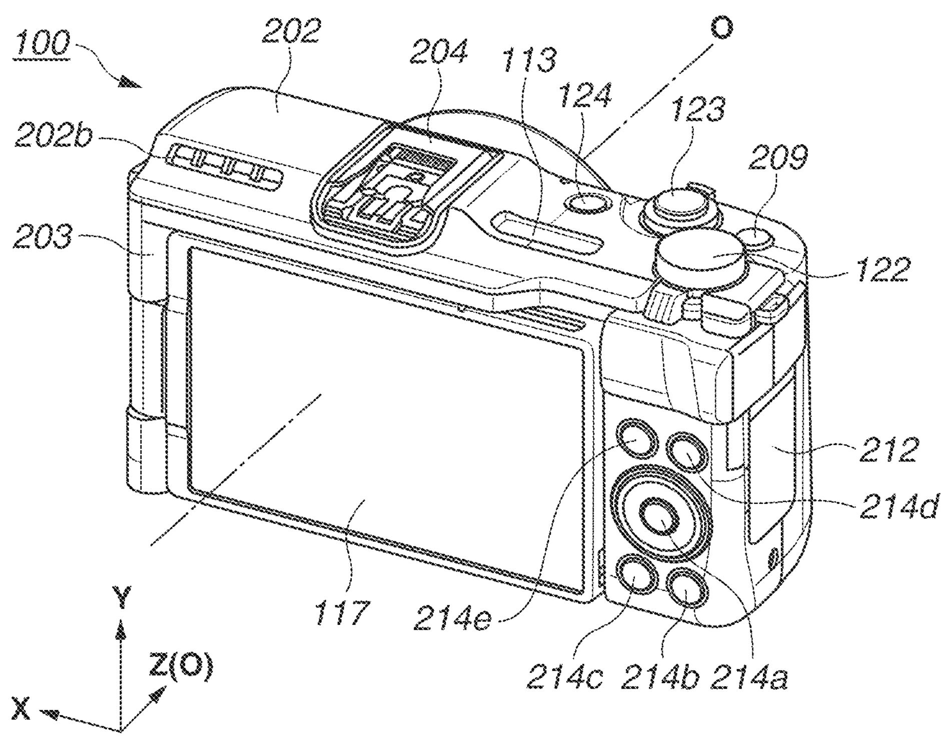

FIG. 2B is a perspective view of the digital camera 100 illustrated in FIG. 2A when viewed from its back surface side.

An axis parallel to an optical axis O of the digital camera 100 is a Z-axis, the height direction is a Y-axis, and the width direction (the horizontal direction) is an X-axis.

These X, Y, and Z axes are common to FIGS. 2A and 2B and other figures in the following description.

As illustrated in FIGS. 2A and 2B, in the digital camera 100, a front cover 201, a top cover 202, a rear cover 203, and a terminal cover 212 that openably and closably cover the communication connector 130 form the exterior of the digital camera 100.

On the front surface side of the digital camera 100, a lens unit 215 is provided.

The lens unit 215 includes the imaging lens 101, the shutter 102, and the imaging section 103.

The lens unit 215 may be either integrated with the digital camera 100 or interchangeable in the digital camera 100.

In an upper surface portion of the digital camera 100, the shutter release button 123, the power button 124, the mode dial 122, a moving image capturing button 209, the microphone 113 that picks up an external sound, and an accessory shoe 204 are provided.

As illustrated in FIG. 2B, on the back surface side of the digital camera 100, the image display section 117 composed of a liquid crystal display (LCD) is provided.

On the right side of the image display section 117 when the digital camera 100 is viewed from the back surface side, a plurality of operation buttons 214*a* to 214*e* included in the operation section 121 is provided.

In the front cover 201, an air intake port 201*a* that is an air intake port of the fan 131 is provided.

In the top cover 202, two air exhaust ports 202*a* and 202*b* that are air exhaust ports of the fan 131 are provided.

The first air exhaust port 202*a* is located on a side surface of the digital camera 100 and provided on a side surface on the opposite side of an operation system such as the shutter release button 123 across the accessory shoe 204.

The second air exhaust port 202*b* is opened to exhaust air in the rear direction of the digital camera 100.

The fan 131 rotates, whereby air flows into the digital camera 100 through the air intake port 201*a*, and the air having flowed in is exhausted through the air exhaust ports 202*a* and 202*b*.

Regarding the air exhaust direction of the first air exhaust port 202*a*, the air is exhausted in the direction of a side surface opposite to the microphone 113 (the positive X-direction) so that the wind of the exhausted air does not hit the microphone 113.

Regarding the air exhaust direction of the second air exhaust port 202*b*, the air is exhausted in the direction of the back surface of the digital camera 100 (the negative Z-direction).

(Heat Dissipation Structure of Entirety of Digital Camera 100)

Figure 3:
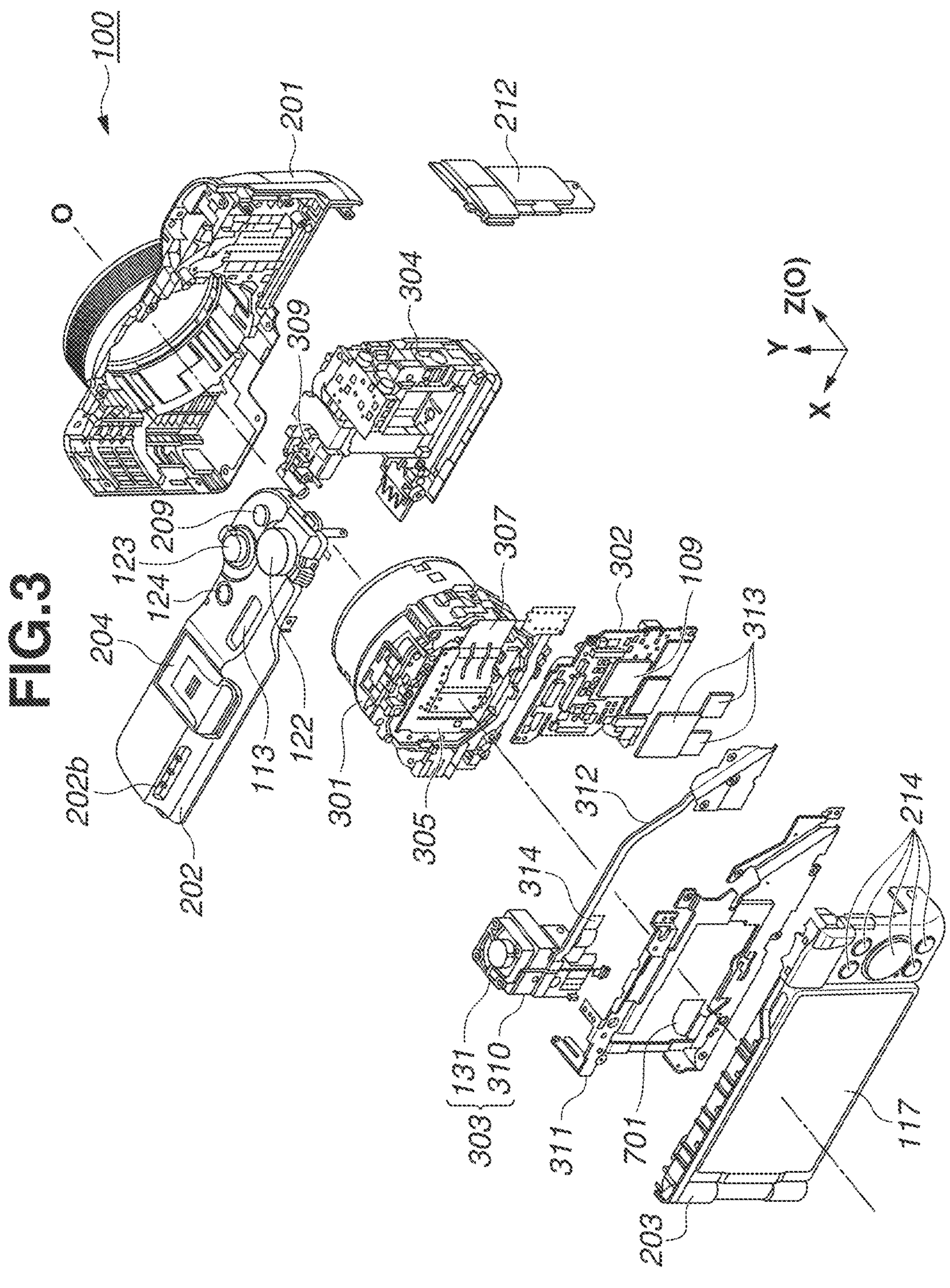
FIG. 3 is an exploded perspective view of the digital camera according to an embodiment.
Figure 4:
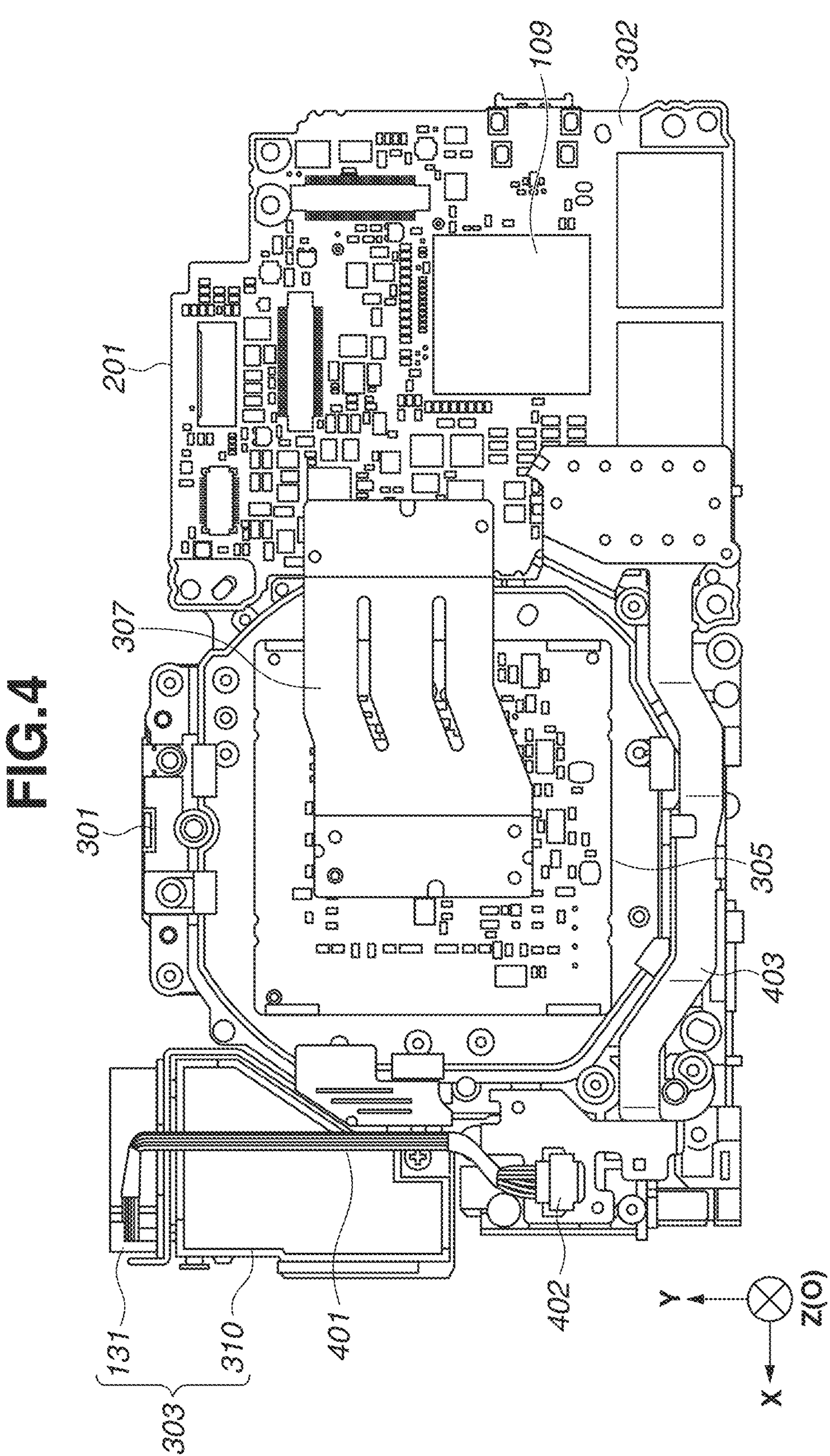
FIG. 4 is an exploded rear view of a digital camera according to a first exemplary embodiment of the present disclosure.

With reference to FIGS. 3 and 4, the heat dissipation structure of the entirety of the digital camera 100 according to the present exemplary embodiment is described.

FIG. 3 is an exploded perspective view of the digital camera 100.

As illustrated in FIG. 3, the front cover 201, the top cover 202, the rear cover 203, and the terminal cover 212 form the exterior of the digital camera 100.

Inside the digital camera 100, an imaging unit 301, a main substrate 302, a cooling unit 303, and a battery chamber unit 304 are placed.

On the main substrate 302, the system control section 109 and a plurality of electronic elements are mounted.

The imaging unit 301 includes the imaging lens 101, the shutter 102, the imaging section 103, and the lens barrier 106.

The imaging substrate 305 is exposed to a back surface of the imaging unit 301 (in the negative Z-direction).

The imaging sensor 306 is an imaging method employing a charge accumulation solid-state image sensor such as a complementary metal-oxide-semiconductor (CMOS) capable of receiving a beam reflected from an object guided by the imaging lens 101 and converting the beam into an electrical image signal.

The imaging sensor 306 is mounted on a front surface of the imaging substrate 305 on the front surface side of the digital camera 100 and placed inside the imaging unit 301.

The imaging sensor 306 is illustrated in FIG. 9.

The imaging substrate 305 controls a voltage for driving the imaging sensor 306 and further transmits an imaging signal output from the imaging sensor 306 to the main substrate 302 via the imaging flexible substrate 307.

The battery chamber unit 304 holds the power supply section 126 and supplies power to the main substrate 302 via a power supply flexible substrate 309.

The cooling unit 303 includes the fan 131 and a duct 310. The duct 310 includes two opening portions. One of the opening portions is connected to the air intake port 201*a*, and the other opening portion is connected to the air exhaust ports 202*a* and 202*b* via the fan 131.

A main chassis 311 is a metal plate member extending in the X-direction of the digital camera 100. The main chassis 311 ensures the stiffness of the digital camera 100 and also holds the cooling unit 303 and a heat pipe 312 by screw fastening.

The heat pipe 312 is a heat transfer member for transmitting the heat of the system control section 109 to the cooling unit 303.

Between the heat pipe 312 and the system control section 109, three pieces of heat conduction rubber 313 are placed, and the heat of the system control section 109 is transmitted to the cooling unit 303 via the three pieces of heat conduction rubber 313 and the heat pipe 312.

The imaging section 103 is thermally connected to the cooling unit 303 via a duct-side graphite sheet 314, and the heat of the imaging section 103 is transmitted to the cooling unit 303 via the duct-side graphite sheet 314.

The imaging unit 301 and the battery chamber unit 304 are fixed with screws to the front cover 201.

The main substrate 302 and the main chassis 311 are fixed with screws to the battery chamber unit 304.

The heat pipe 312 is fixed with screws to the main chassis 311 as described above, thereby being fixed integrally with the main chassis 311 to the battery chamber unit 304.

With the above configuration, heat dissipation paths of the system control section 109 and the imaging section 103 to the cooling unit 303 are formed via the heat pipe 312.

Heat transmitted to the cooling unit 303 is exhausted to outside the digital camera 100 by the fan 131.

Although the digital camera 100 according to the present exemplary embodiment uses a heat pipe, heat conduction rubber, and a graphite sheet as heat transfer members, the present disclosure is not limited to these.

For example, a metal plate composed of a metal material having relatively high heat conductivity, such as aluminum, copper, or magnesium, may be used.

The system control section 109 and the imaging section 103 consume particularly great power in the digital camera 100 and also generate significant amounts of heat, and therefore, the temperatures of the system control section 109 and the imaging section 103 are likely to rise.

Thus, the imaging possible time of the digital camera 100 is limited by the operation guaranteeing temperatures of the system control section 109 and the imaging section 103 except for the remaining life of the battery.

To maximize the imaging possible time, the system control section 109 and the imaging section 103 should be cooled, thereby preventing the temperatures of the system control section 109 and the imaging section 103 from exceeding recommended operational service range temperatures.

To this end, the digital camera 100 according to the present disclosure includes the above heat dissipation structure.

The heat of the system control section 109 and the imaging section 103 transmitted to the duct 310 is exhausted by the fan 131, whereby it is possible to perform forced air cooling on the system control section 109 and the imaging section 103 and reduce the temperature rises in the system control section 109 and the imaging section 103.

(Exploded Rear View of Digital Camera 100)

FIG. 4 is an exploded rear view of the digital camera 100. FIG. 4 omits the front cover 201, the top cover 202, and the rear cover 203.

The fan 131 is electrically connected to the main substrate 302 via a lead 401, a flexible substrate connector 402, and a control flexible substrate 403.

The driving of the fan 131 is controlled by transmitting a control signal from the system control section 109 to the fan 131 via the lead 401, the flexible substrate connector 402, the control flexible substrate 403, and the main substrate 302.

The control flexible substrate 403 transmits not only a control signal for the fan 131 but also control signals for the imaging lens 101 and the shutter 102 from the system control section 109 to the lens unit 215.

A control signal transmitted via the lead 401 and the control flexible substrate 403 is a high-frequency signal similar to an imaging signal output from the imaging sensor 306 and is likely to cause crosstalk with the imaging signal.

As a result, there is a possibility that the output of the imaging signal changes, and the image processing section 111 cannot generate a desired still image or moving image.

Thus, it is desirable that the control signal and the imaging signal do not overlap each other.

Accordingly, in the digital camera 100 according to the present exemplary embodiment, as illustrated in FIG. 4, the fan 131, the lead 401, and the control flexible substrate 403 do not overlap the imaging substrate 305 and the imaging flexible substrate 307 in the direction of the optical axis O (the Z-direction).

Consequently, it is possible to perform forced air cooling on the system control section 109 and the imaging section 103 using the cooling unit 303 and reduce the temperature rises in the system control section 109 and the imaging section 103 without hindering the generation of a still image or a moving image by the image processing section 111.

(Miniaturization of Digital Camera 100)

With reference to FIGS. 5A to 5D, FIGS. 6A and 6B, and FIGS. 10A and 10B, the placement of the main substrate 302 and the imaging substrate 305 relative to the cooling unit 303 is described.

Figures 5A, 5B, 5C, 5D:
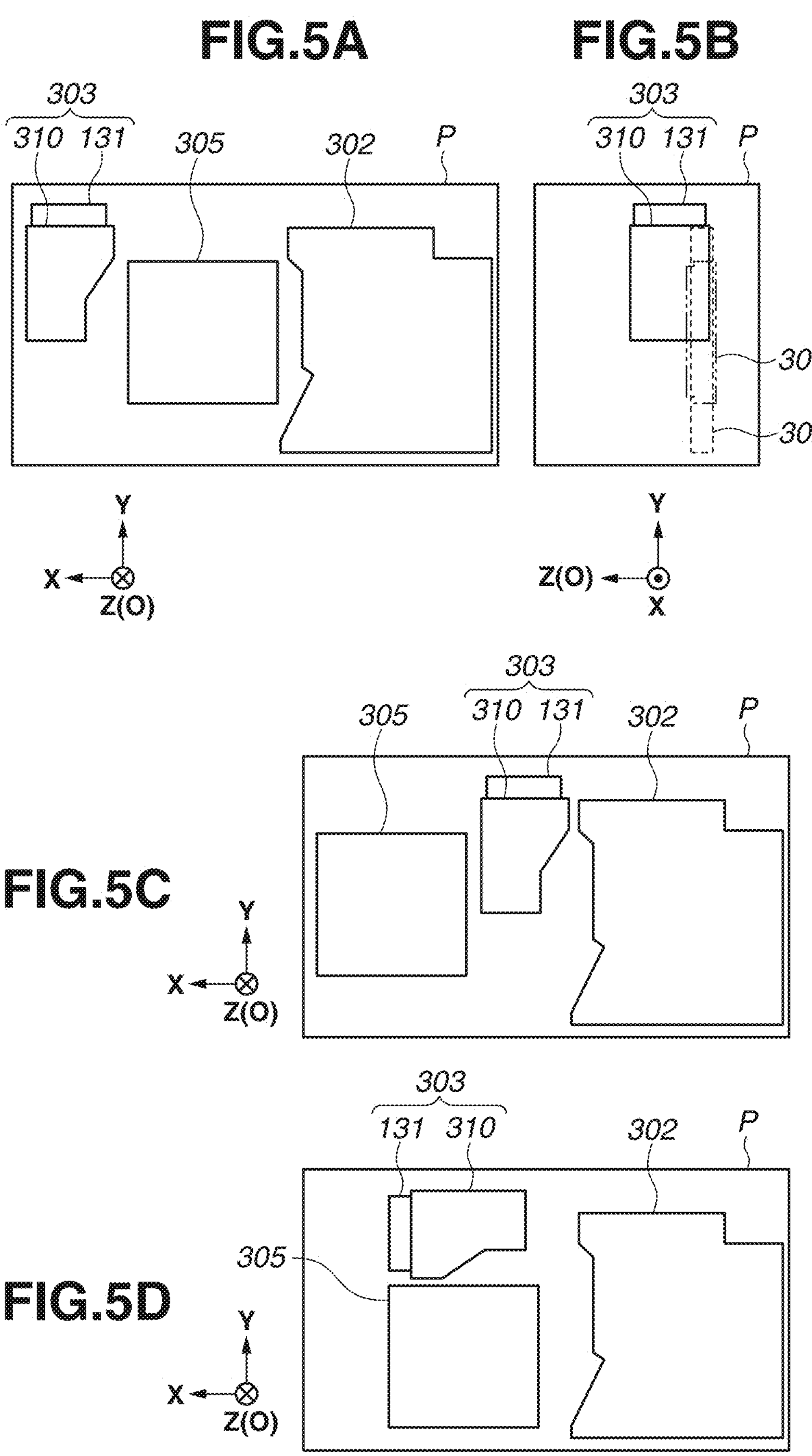
FIGS. 5A to 5D are schematic rear views of the digital camera according to the present disclosure.

FIG. 5A is a schematic rear view of the digital camera 100. FIG. 5B is a schematic side view of the digital camera 100.

The cooling unit 303, the main substrate 302, and the imaging substrate 305 are schematically illustrated in FIGS. 5A to 5D to explicitly indicate the relative placement of the cooling unit 303, the main substrate 302, and the imaging substrate 305, with other components being illustrated in FIGS. 6A, 6B, 7 and 9.

A solid frame P illustrated in FIG. 5A indicates the outermost shape of the digital camera 100 formed by the front cover 201, the top cover 202, the rear cover 203, and the terminal cover 212.

As illustrated in FIG. 5A, the cooling unit 303, the main substrate 302, and the imaging substrate 305 are placed without protruding from the solid frame P.

Consequently, the digital camera 100 does not partially expand in the X-direction or the Y-direction.

The main substrate 302 and the imaging substrate 305 are placed side by side without overlapping the cooling unit 303 in the direction of the optical axis O (the Z-direction).

In FIG. 5B, the main substrate 302 and the imaging substrate 305 are overlap the cooling unit 303 in the X-direction.

Figure 10A:
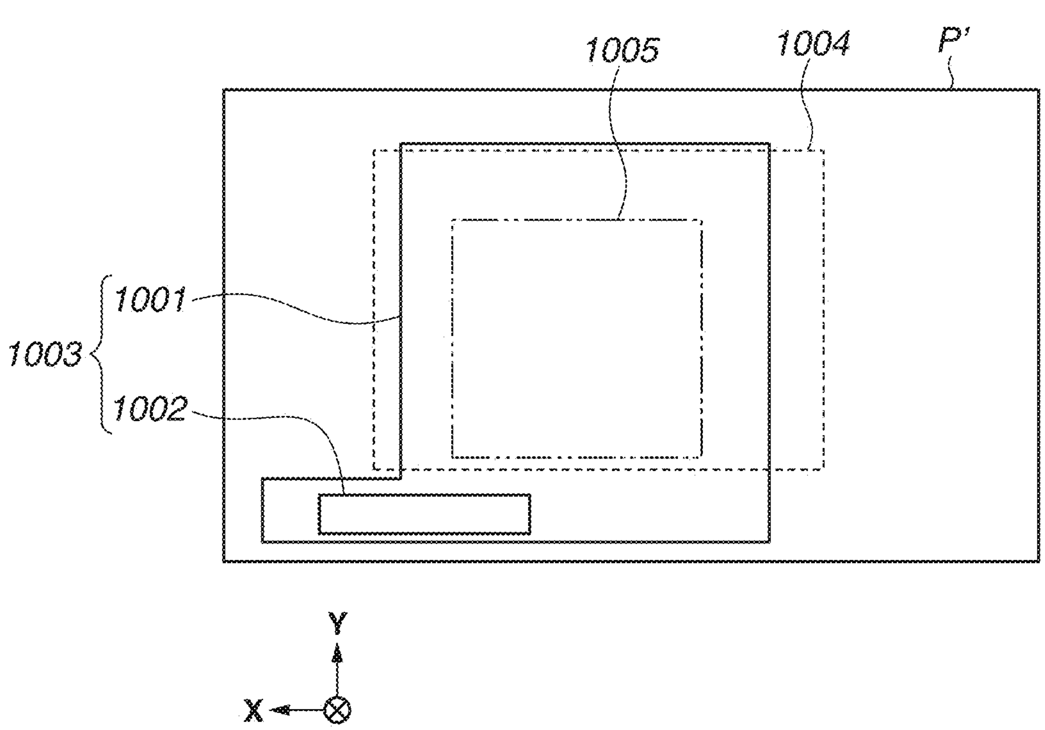
FIGS. 10A and 10B are a schematic rear view and a schematic side view of a conventional imaging apparatus, respectively.
Figure 10B:
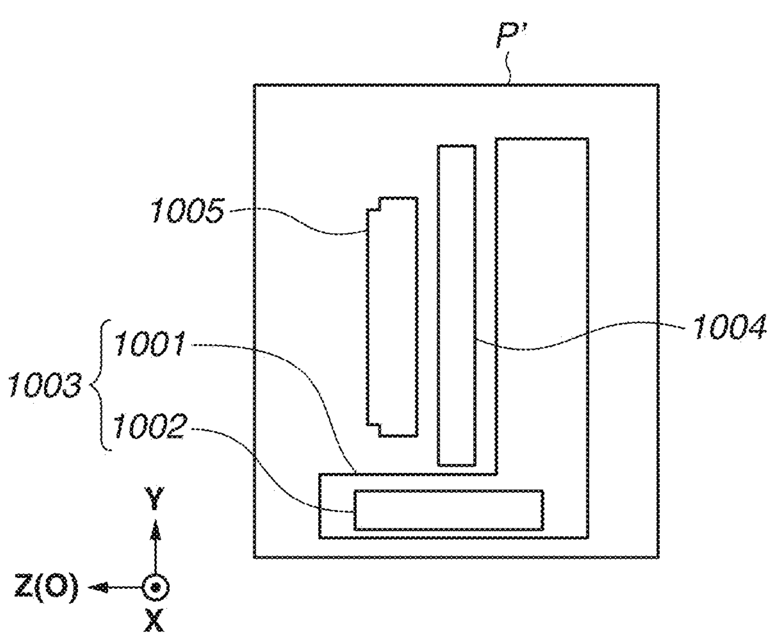

The configuration of a conventional imaging apparatus in FIGS. 10A and 10B is referred to for comparison with the digital camera 100 according to the present exemplary embodiment.

FIG. 10A is a schematic rear view of the conventional imaging apparatus illustrating the placement of a main substrate 1004 and the imaging substrate 1005 relative to the cooling section 1003. FIG. 10B is a schematic side view of the conventional imaging apparatus illustrating the placement of the main substrate 1004 and the imaging substrate 1005 relative to the cooling section 1003.

Similarly to FIGS. 5A to 5D, a solid frame P' illustrated in FIGS. 10A and 10B indicates the outermost shape of the imaging apparatus in the conventional example.

As illustrated in FIG. 10A, the main substrate 1004 and the imaging substrate 1005 overlap the cooling section 1003 in the optical axis direction (the Z-direction) of an imaging sensor.

In FIG. 10B, the main substrate 1004 and the imaging substrate 1005 do not overlap the cooling section 1003 in the X-direction.

Comparison of FIGS. 5B and 10B shows that the space for placing the cooling unit 303, the main substrate 302, and the imaging substrate 305 is smaller than the space for placing the cooling section 1003, the main substrate 1004, and the imaging substrate 1005.

As a result, the solid frame P is smaller than the solid frame P' in the Z-direction.

That is, the digital camera 100 according to the present exemplary embodiment is smaller than the conventional imaging apparatus.

With the above configuration, the main substrate 302 and the imaging substrate 305 are placed side by side without overlapping the cooling unit 303 in the direction of the optical axis O (the Z-direction), whereby it is possible to miniaturize the digital camera 100 according to the present disclosure in the Z-direction compared to the conventional imaging apparatus.

The placement of the cooling unit 303, the main substrate 302, and the imaging substrate 305 is not limited to that in FIG. 5A, and it is also possible to similarly miniaturize the digital camera 100 by relatively replacing the placement of these three components.

For example, in FIG. 5C, the main substrate 302, the cooling unit 303, and the imaging substrate 305 are placed in this order in the positive X-direction to fall within the solid frame P.

In FIG. 5D, the main substrate 302 and the imaging substrate 305 are placed in this order in the positive X-direction to fall within the solid frame P.

Further, the cooling unit 303 is placed in the positive Z-direction relative to the imaging substrate 305.

That is, the main substrate 302, the imaging substrate 305, and the cooling unit 303 are placed in an approximately L-shape within the solid frame P.

In both FIGS. 5C and 5D, a heat dissipation path from the main substrate 302 or the imaging substrate 305 to the cooling unit 303 can be formed similarly using heat transfer members such as a heat pipe, heat conduction rubber, and a graphite sheet.

Figure 6A:
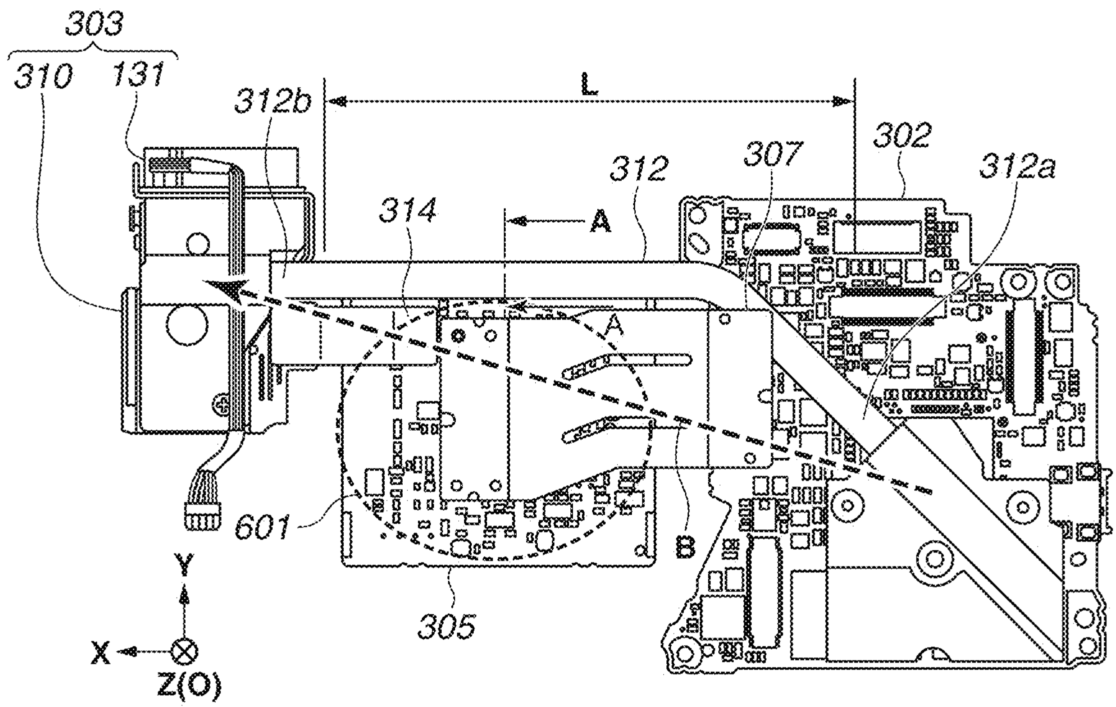
FIGS. 6A and 6B are external views illustrating placement of a heat pipe relative to an imaging substrate that is a component of the digital camera according to the present disclosure.
Figure 6B:
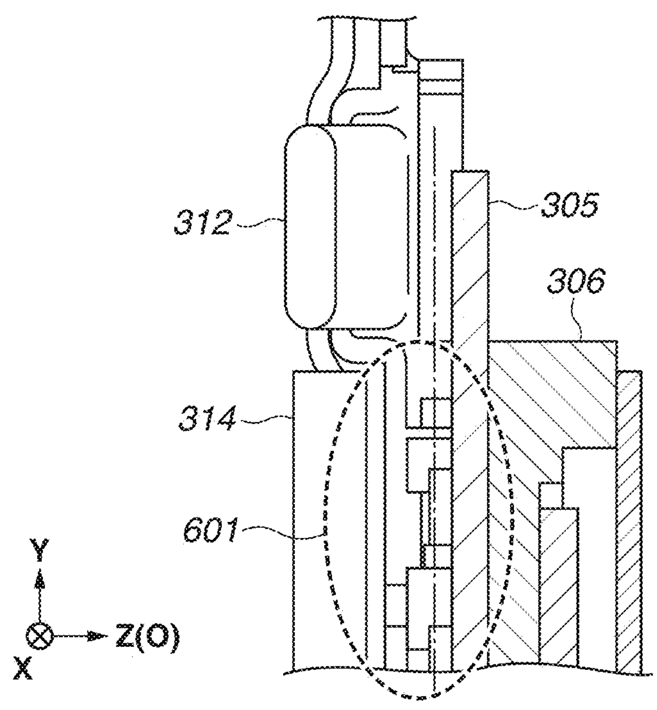

Next, with reference to FIGS. 6A and 6B, a description is given of a configuration for ensuring the heat dissipation property of the system control section 109 while enabling the miniaturization of the digital camera 100.

FIG. 6A is an exploded rear view illustrating the placement of the heat pipe 312 relative to the imaging substrate 305. FIG. 6B is an A-A cross-sectional view in FIG. 6A.

As illustrated in FIG. 6A, near the section line of the A-A cross-sectional view, the heat pipe 312 overlaps the imaging substrate 305 in the direction of the optical axis O (the Z-direction).

To efficiently transmit the heat of the system control section 109 to the cooling unit 303, it is desirable that the thermal resistance of the heat pipe 312 may be small.

That is, it is desirable that the heat pipe 312 may connect the system control section 109 and the cooling unit 303 at the shortest distance, i.e., by a path indicated by a dashed arrow B.

However, to place the heat pipe 312 as indicated by the dashed arrow B, it is necessary to place the heat pipe 312 by avoiding an electronic element group 601 on the imaging substrate 305 and the imaging flexible substrate 307 in the negative Z-direction so as not to interfere with the electronic element group 601 on the imaging substrate 305 and the imaging flexible substrate 307.

By an amount corresponding to the placement of the heat pipe 312 by avoiding the electronic element group 601 on the imaging substrate 305 and the imaging flexible substrate 307 in the negative Z-direction, the digital camera 100 becomes large in the Z-direction.

Accordingly, in the digital camera 100 according to the present exemplary embodiment, two bent portions 312*a* and 312*b* are provided in the heat pipe 312.

As illustrated in FIG. 6A, the heat pipe 312 overlaps the imaging substrate 305 in the direction of the optical axis O (the Z-direction) in a section L from the bent portion 312*a* to the bent portion 312*b*.

On the other hand, the heat pipe 312 is placed on approximately the same plane as the imaging substrate 305 in a section except for the section L.

As illustrated in FIG. 6B, in the section L, the heat pipe 312 passes through a place where neither the electronic element group 601 on the imaging substrate 305 nor the imaging flexible substrate 307 is placed.

With the above configuration, the heat pipe 312 prevents the avoidance of the imaging section 103 in the negative Z-direction while connecting the system control section 109 and the cooling unit 303 at the shortest distance.

As a result, it is possible to ensure the heat dissipation property of the system control section 109 while miniaturizing the digital camera 100.

The features of the first exemplary embodiment are enumerated below.

Figure 7:
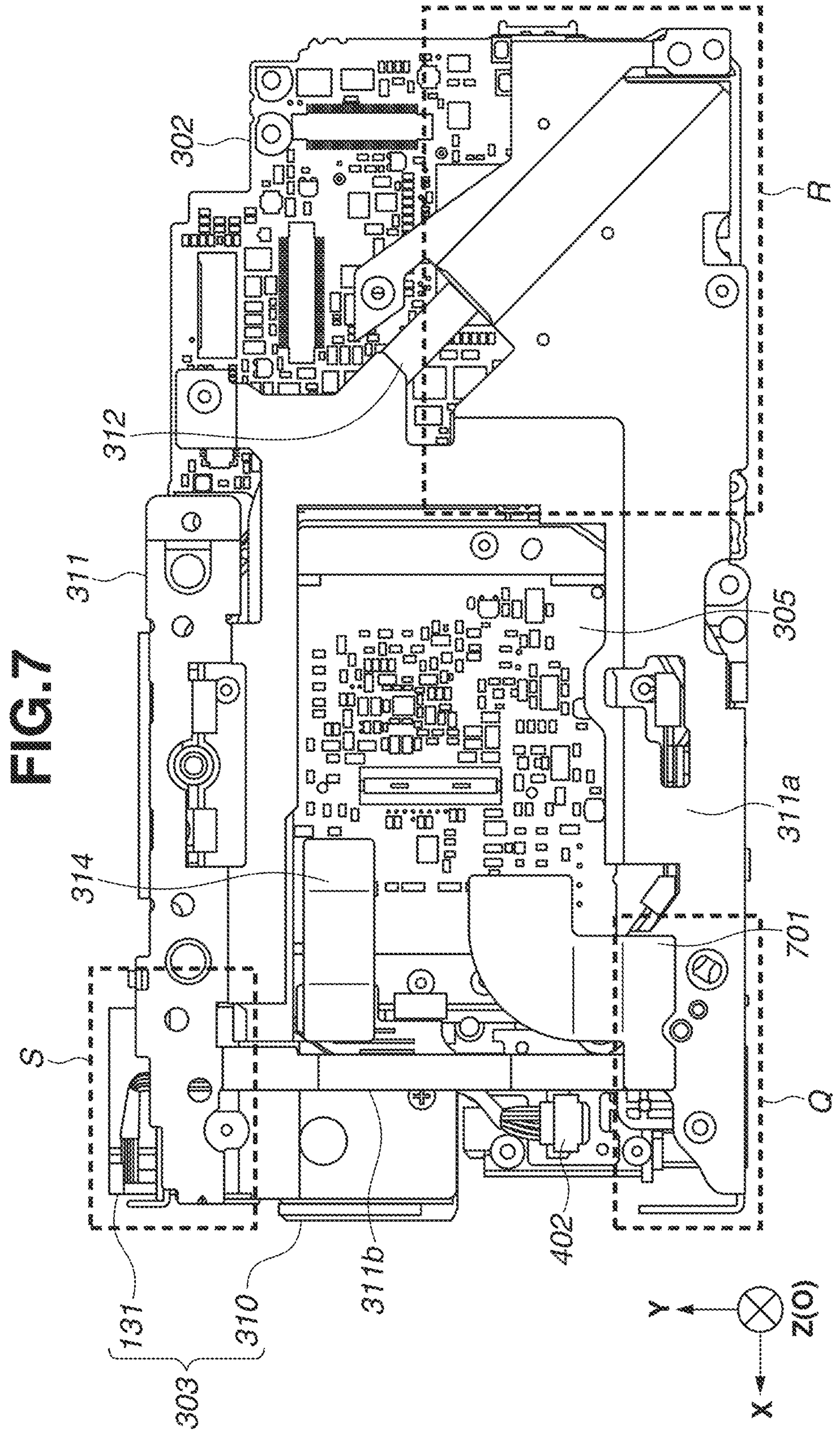
FIG. 7 is an exploded rear view of a digital camera according to a second exemplary embodiment of the present disclosure.

With reference to FIGS. 5A and 7, a first feature is described.

An imaging apparatus includes an imaging sensor 306 that captures an image of an object, an imaging substrate 305 on which the imaging sensor 306 is mounted, a control substrate (main substrate) 302 on which an electronic element 109 that performs imaging processing of the imaging sensor 306 is mounted, and a cooling unit 303.

The cooling unit 303 includes a duct 310 thermally connected to the imaging substrate 305 and the control substrate 302, and a fan 131 that is thermally connected to the duct 310 and generates air flow for cooling the imaging substrate 305 and the control substrate 302.

With respect to an optical axis direction of the imaging sensor 306, the imaging substrate 305, the control substrate 302, and the cooling unit 303 do not overlap each other.

With reference to FIGS. 5A and 7, a second feature is described.

The imaging substrate 305, the control substrate 302, and the cooling unit 303 are stored inside an exterior cover of the imaging apparatus.

The imaging substrate 305, the control substrate 302, and the cooling unit 303 are stored inside the exterior cover of the imaging apparatus without protruding from an outermost shape of the exterior cover of the imaging apparatus.

With reference to FIGS. 5A and 7, a third feature is described.

With respect to the optical axis direction of the imaging sensor 306, the imaging substrate 305, the control substrate 302, and the cooling unit 303 are placed in order in a long side direction of the outermost shape of the exterior cover of the imaging apparatus.

With reference to FIGS. 5A and 7, a fourth feature is described.

With respect to the optical axis direction of the imaging sensor 306, an upper end of the cooling unit 303 is placed above upper ends of the imaging substrate 305 and the control substrate 302.

With reference to FIG. 6A, a fifth feature is described.

The imaging substrate 305 and the control substrate 302 are thermally connected to the duct 310 by coming into contact with a first heat conduction sheet (duct-side graphite sheet) 314 and a heat conduction member (heat pipe) 312, respectively.

With reference to FIG. 6A, a sixth feature is described.

The heat conduction member 312 thermally connecting the control substrate 302 and the cooling unit 303 includes a first portion overlapping the imaging substrate 305 in the optical axis direction of the imaging sensor 306, and a second portion that does not overlap the imaging substrate 305 in the optical axis direction of the imaging sensor 306.

An electronic element 601 mounted on the imaging substrate 305 and a flexible substrate 307 into which a signal line electrically connected to the electronic element 601 is built are placed in the second portion and not placed in the first portion.

With reference to FIG. 4, a seventh feature is described.

The fan 131 is thermally connected to signal transmitter (lead, flexible substrate connector, and control flexible substrate) 401, 402, and 403 that transmit a control signal from the electronic element 109 mounted on the control substrate 302.

With respect to the optical axis direction of the imaging sensor 306, the signal transmitter 401, 402, and 403 do not overlap the imaging substrate 305.

With reference to FIG. 7, an eighth feature is described.

The imaging apparatus includes the first heat conduction sheet 314 that does not include a signal line and thermally connects the imaging substrate 305 and the cooling unit 303.

The imaging apparatus includes a second heat conduction sheet 701 that does not include a signal line and thermally connects the imaging substrate 305 and a metal member 311 that is placed inside the imaging apparatus to dissipate heat.

Thermal resistance of the second heat conduction sheet 701 is smaller than thermal resistance of the first heat conduction sheet 314.

With respect to the optical axis direction of the imaging sensor 306, the second heat conduction sheet 701 do not overlap the control substrate 302 and the cooling unit 303.

With reference to FIGS. 4 and 6A, a ninth feature is described.

In an optical axis direction Z of the imaging apparatus, a top surface of the flexible substrate 307 is further away from a back surface of the imaging substrate 305 than a top surface of the heat conduction member 312 is.

Figure 8:
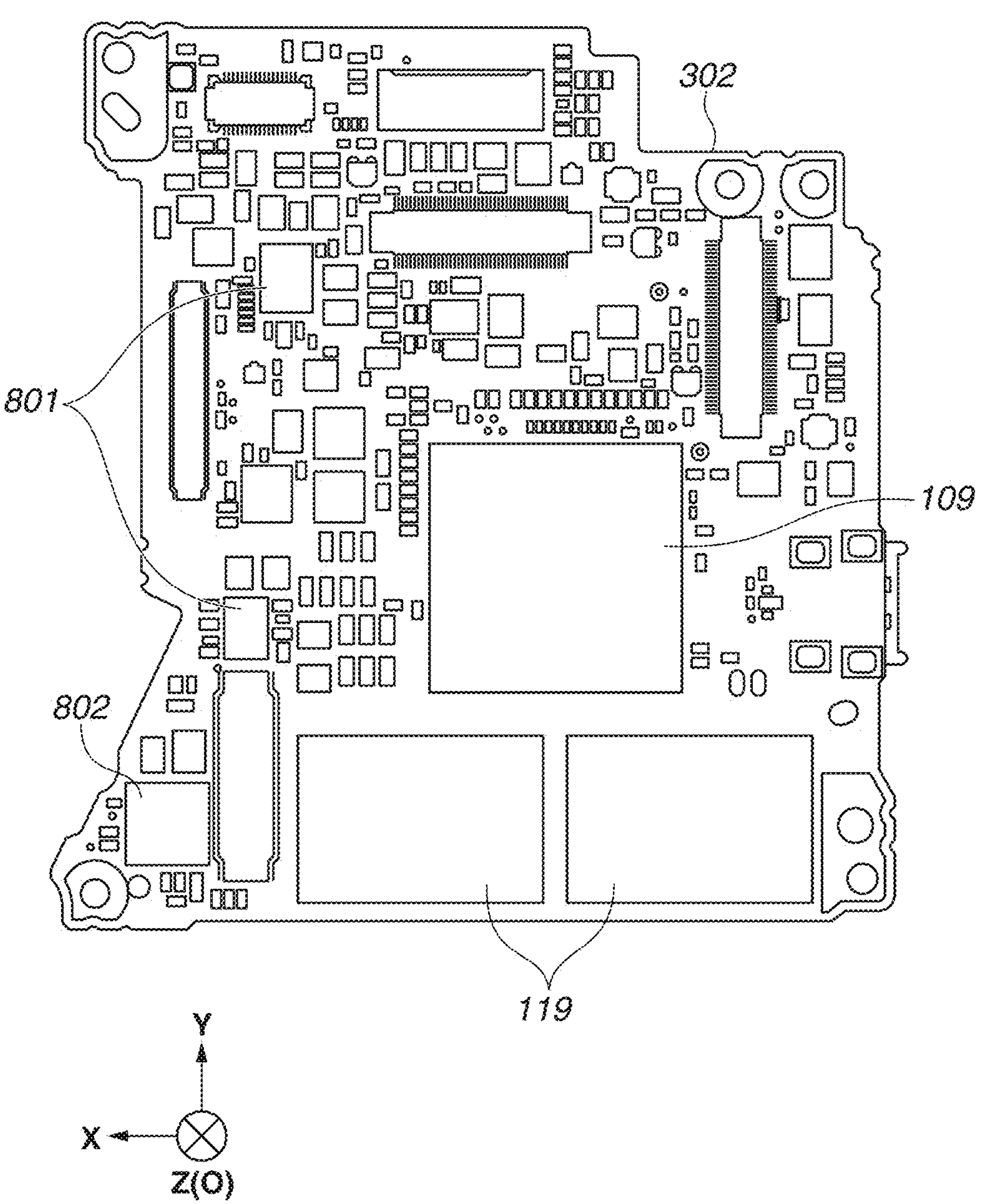
FIG. 8 is an external view of a main substrate that is a component of the digital camera according to the present disclosure.

With reference to FIGS. 7 and 8, a tenth feature is described.

The first heat conduction sheet 314 and the second heat conduction sheet 701 are graphite sheets.

(Heat Dissipation Structure of Imaging Substrate 305)

With reference to FIG. 7, the heat dissipation structure of the imaging substrate 305 is described.

FIG. 7 is an exploded rear view of the digital camera 100 according to a second exemplary embodiment.

FIG. 7 illustrates a duct-side graphite sheet 314 that does not include a signal line, a main-side graphite sheet (second heat conduction sheet) 701 that does not include a signal line, and the main chassis 311 as components related to the heat dissipation structure of the imaging substrate 305 in addition to the exploded rear view in FIG. 4.

A signal line is a wire including a control signal such as an imaging signal.

As illustrated in FIG. 7, on the imaging substrate 305, the duct-side graphite sheet 314 and the main-side graphite sheet 701 are placed as two heat dissipation paths.

The duct-side graphite sheet 314 does not include a signal line and thermally connects the imaging substrate 305 and the duct 310, and the heat of the imaging sensor 306 is transmitted to the duct 310 via the imaging substrate 305 and the duct-side graphite sheet 314.

Further, the fan 131 rotates, generates air flow in the duct 310, and exhausts air, thereby exhausting the heat transmitted to the duct 310 to outside the digital camera 100.

By this heat dissipation path formed by the duct-side graphite sheet 314, the heat of the imaging sensor 306 is subjected to forced air cooling by the cooling unit 303. Thus, it is possible to reduce the temperature rise in the imaging sensor 306.

(Heat Sources of Main Substrate 302 and Imaging Substrate 305)

With reference to FIGS. 8 and 9, heat sources of the main substrate 302 and the imaging substrate 305 are described.

FIG. 8 is an external rear view of the main substrate 302.

FIG. 9 is an external front view of the imaging substrate 305.

As illustrated in FIG. 8, on the main substrate 302, the system control section 109, the system memory 119, a DC/DC converter 801, and a driving control integrated circuit (IC) 802 that are heat sources are placed.

The system control section 109 is a control IC that controls the entirety of the digital camera 100.

The system memory 119 is the above volatile recording element. Two system memories 119 are mounted on the main substrate 302.

The DC/DC converter 801 is a voltage conversion element. The DC/DC converter 801 converts a voltage from the power supply section 126 and supplies power to the system control section 109 and electric elements mounted on the main substrate 302.

Two DC/DC converters 801 are mounted on the main substrate 302.

The driving control IC 802 is a control IC that controls the driving of the fan 131 and the lens unit 215.

A total of the above six heat sources are mounted on the main substrate 302.

Next, as illustrated in FIG. 9, the imaging sensor 306 is mounted on the front surface of the imaging substrate 305 on the front surface side of the digital camera 100.

The imaging sensor 306 is an imaging method of the digital camera 100 according to the present exemplary embodiment.

A heat source on the imaging substrate 305 is only a single heat source, namely the imaging sensor 306.

As described above, the number of heat sources placed on the main substrate 302 is greater than the number of heat sources placed on the imaging sensor 306.

Thus, the total power consumption of the main substrate 302 is greater than that of the imaging substrate 305, and the amount of heat generated by the main substrate 302 is also greater than the amount of heat generated by the imaging substrate 305.

As a result, the amount of heat transmitted from the main substrate 302 to the cooling unit 303 is also greater than the amount of heat transmitted from the imaging substrate 305 to the cooling unit 303.

Thus, the proportion of the main substrate 302 to the heat capacity of the duct 310 is greater than that of the imaging substrate 305, and the amount of heat transmitted from the imaging sensor 306 to the duct 310 is inevitably small.

As described above, in a case where the fan 131 is rotating, the heat of the system control section 109 and the imaging sensor 306 transmitted to the duct 310 is exhausted to outside the digital camera 100 by forced air cooling.

Thus, it is possible to reduce the temperature rises in the system control section 109 and the imaging sensor 306 without making the heat capacity of the duct 310 tight.

However, in a case where the fan 131 is stopped, the cooling unit 303 does not perform forced air cooling, and the duct 310 functions as a heat sink.

This results in an issue where the imaging sensor 306 cannot obtain the effect of dissipating heat greater than or equal to the heat capacity of the duct 310, and the temperature of the imaging sensor 306 rises.

As a method for solving this issue, it is possible that the heat capacity of the duct 310 is increased. In this case, however, the duct 310 becomes large, and therefore, the digital camera 100 may become large.

Accordingly, the digital camera 100 according to the present disclosure includes the main-side graphite sheet 701 as a heat dissipation path of the imaging substrate 305 that does not depend on the cooling unit 303.

The main-side graphite sheet 701 thermally connects the imaging substrate 305 and the main chassis 311, and the heat of the imaging sensor 306 is transmitted to the main chassis 311 via the imaging substrate 305 and the main-side graphite sheet 701.

By this heat dissipation path formed by the main-side graphite sheet 701, the heat of the imaging sensor 306 is naturally dissipated to the main chassis 311 via the imaging substrate 305 and the main-side graphite sheet 701. Thus, it is possible to reduce the temperature rise in the imaging sensor 306.

Then, the amount of heat dissipated from the imaging sensor 306 to the main chassis 311 by this heat dissipation path does not depend on the heat capacity of the duct 310.

With the above configuration, even if the fan 131 is stopped, the heat of the imaging sensor 306 is naturally dissipated via the main-side graphite sheet 701. Thus, it is possible to reduce the temperature rise in the imaging sensor 306.

Next, a configuration for effectively preventing the temperature rise in the imaging sensor 306 is described.

First, the thermal resistance of the duct-side graphite sheet 314 is configured to be higher than that of the main-side graphite sheet 701.

To prevent heat transmitted from the main substrate 302 from flowing into the imaging substrate 305 via the duct 310, it is desirable that the thermal resistance of the duct-side graphite sheet 314 may be high.

On the other hand, to make heat likely to be transmitted from the imaging substrate 305 to the main chassis 311, it is desirable that the thermal resistance of the main-side graphite sheet 701 may be low.

Thus, in the digital camera 100 according to the present exemplary embodiment, the thermal resistance of the duct-side graphite sheet 314 is configured to be higher than that of the main-side graphite sheet 701.

Consequently, it is possible to effectively reduce the temperature rise in the imaging sensor 306.

Examples of the method for making thermal resistance great include a method for selecting a material having low heat conductivity, a method for making the cross-sectional area of a heat dissipation path small, and a method for making the length of a heat dissipation path long.

A place where the main-side graphite sheet 701 and the main chassis 311 are connected together is set in a region Q that is a portion of the main chassis 311 that is not opposed to the main substrate 302 and the duct 310.

A portion of the main chassis 311 opposed to the main substrate 302 is a region R, and a portion of the main chassis 311 opposed to the duct 310 is a region S.

The regions R and S are thermally connected by screw fastening to the main substrate 302 that is a heat source or the duct 310 that is the heat transmission destination of the main substrate 302, and therefore, the temperatures of the regions R and S become high.

On the other hand, a heat source is not present near the region Q compared to the regions R and S, and therefore, the temperature of the region Q is relatively low.

Thus, the main-side graphite sheet 701 is thermally connected to the region Q, whereby the heat of the imaging sensor 306 is more likely to be transmitted to the main chassis 311.

Further, as illustrated in FIG. 7, a connection portion 311*a* between the regions Q and R and a connection portion 311*b* between the regions Q and S are formed so that the cross-sectional areas of the connection portions 311*a* and 311*b* are smaller than the cross-sectional area of another portion of the main chassis 311.

The cross-sectional area of the main chassis 311 is made small, whereby the thermal resistance of the main chassis 311 is locally great in the connection portions 311*a* and 311*b*.

Thus, it is possible to prevent the transmission of heat from the regions R and S to the region Q and reduce the temperature rise in the region Q.

As a result, the heat of the imaging sensor 306 is more likely to be transmitted to the main chassis 311 via the main-side graphite sheet 701.

With the above configuration, it is possible to effectively reduce the temperature rise in the imaging sensor 306.

The above exemplary embodiments are exemplifications for describing techniques according to the present disclosure, and the techniques according to the present disclosure can be appropriately changed or carried out in combination without departing from the spirit thereof.

Specifically, the present disclosure is not limited to a digital camera, and can be widely applied to an electronic device and an imaging apparatus having a moving image capturing function, such as a video camera and a network camera.

With reference to FIG. 7, an eleventh feature is described.

An imaging apparatus includes an imaging sensor 306 that captures an image of an object, an imaging substrate 305 on which the imaging sensor 306 is mounted, a control substrate 302 on which an electronic element 109 that performs imaging processing of the imaging sensor 306 is mounted, and a cooling unit 303.

The cooling unit 303 includes a duct 310 thermally connected to the imaging substrate 305 and the control substrate 302, and a fan 131 that is thermally connected to the duct 310 and generates air flow for cooling the imaging substrate 305 and the control substrate 302.

The imaging apparatus includes a first heat conduction sheet 314 that does not include a signal line and thermally connects the imaging substrate 305 and the cooling unit 303.

The imaging apparatus includes a second heat conduction sheet 701 that does not include a signal line and thermally connects the imaging substrate 305 and a metal member (main chassis) 311 that is placed inside the imaging apparatus to dissipate heat.

Thermal resistance of the second heat conduction sheet 701 is smaller than thermal resistance of the first heat conduction sheet 314.

With respect to the optical axis direction of the imaging sensor 306, the second heat conduction sheet 701 do not overlap the control substrate 302 and the cooling unit 303.

With reference to FIG. 7, a twelfth feature is described.

The imaging substrate 305 and the control substrate 302 are each thermally connected to the duct 310.

An amount of heat generated by the control substrate 302 is greater than an amount of heat generated by the imaging substrate 305.

With reference to FIGS. 7 and 8, a thirteenth feature is described.

The metal member 311 includes a first region S thermally connected to the duct 310, and a second region R thermally connected to the control substrate 302.

The second heat conduction sheet 701 is thermally connected to the metal member 311 in a third region Q different from the first region S and the second region R.

The third region Q is thermally connected to the first region S in a first connection portion 311*b*, and the third region Q is thermally connected to the second region R in a second connection portion 311*a*.

A cross-sectional area of the first connection portion 311*b* is smaller than a cross-sectional area of the first region S.

A cross-sectional area of the second connection portion 311*a* is smaller than a cross-sectional area of the second region R.

With reference to FIGS. 7 and 8, a fourteenth feature is described.

The first heat conduction sheet 314 and the second heat conduction sheet 701 are graphite sheets.

The above exemplary embodiments are exemplifications for describing techniques according to the present disclosure, and the techniques according to the present disclosure can be appropriately changed or carried out in combination without departing from the spirit thereof.

Further, embodiments are illustrated below.

(Configuration 1)

An imaging apparatus including:

an imaging sensor 306 configured to capture an image;

an imaging substrate 305 on which the imaging sensor 306 is mounted;

a control substrate 302 on which an electronic element 109 configured to perform imaging processing of the imaging sensor 306 is mounted; and a cooling unit 303, wherein the cooling unit 303 includes a duct 310 thermally connected to the imaging substrate 305 and the control substrate 302, and a fan 131 thermally connected to the duct 310 and configured to generate air flow for cooling the imaging substrate 305 and the control substrate 302, and wherein the imaging substrate 305, the control substrate 302, and the cooling unit 303 are placed along an optical axis direction of the imaging sensor 306, without overlapping each other (FIGS. 4, 5A, and 7).

(Configuration 2)

The imaging apparatus according to configuration 1, wherein the imaging substrate 305, the control substrate 302, and the cooling unit 303 are positioned inside an exterior cover of the imaging apparatus, without protruding from an outermost shape of the exterior cover (FIG. 5A).

(Configuration 3)

The imaging apparatus according to configuration 1 or 2, wherein with respect to the optical axis direction of the imaging sensor 306, the imaging substrate 305, the control substrate 302, and the cooling unit 303 are placed in order along a long side direction of the outermost shape of the exterior cover of the imaging apparatus.

(Configuration 4)

The imaging apparatus according to any one of configurations 1 to 3, wherein with respect to the optical axis direction of the imaging sensor 306, an upper end of the cooling unit 303 is placed above upper ends of the imaging substrate 305 and the control substrate 302.

(Configuration 5)

The imaging apparatus according to any one of configurations 1 to 4, wherein the imaging substrate 305 and the control substrate 302 are thermally connected to the duct 310 by contacting at least one of heat conduction members 312 and 314 (FIGS. 6A and 6B).

(Configuration 6)

The imaging apparatus according to any one of configurations 1 to 5, wherein, with respect to the optical axis direction of the imaging sensor 306, the heat conduction member 312 includes a first portion overlapping the imaging substrate 305 in the optical axis direction of the imaging sensor 306, and a second portion that does not overlap the imaging substrate 305 in the optical axis direction of the imaging sensor 306, and wherein another electronic element 601 mounted on the imaging substrate 305 and a flexible substrate 307 into which a signal line electrically connected to the electronic element is built is placed in the second portion and is not placed in the first portion.

(Configuration 7)

The imaging apparatus according to any one of configurations 1 to 6, wherein the fan 131 is thermally connected to at least one signal transmitter 401, 402, and 403 configured to transmit a control signal from the electronic element 109 mounted on the control substrate 302, and wherein, with respect to the optical axis direction of the imaging sensor 306, the at least one signal transmitter 401, 402, and 403 does not overlap the imaging substrate 305 (FIG. 4).

(Configuration 8)

The imaging apparatus according to any one of configurations 1 to 7, further including:

a first heat conduction sheet 314 that does not include a signal line and thermally connects the imaging substrate 305 and the cooling unit 303; and a second heat conduction sheet 701 that does not include a signal line and thermally connects the imaging substrate 305 and a metal member 311 placed inside the imaging apparatus and configured to dissipate heat, wherein thermal resistance of the second heat conduction sheet 701 is smaller than thermal resistance of the first heat conduction sheet 314, and wherein with respect to the optical axis direction of the imaging sensor 306, the second heat conduction sheet 701 does not overlap the control substrate 302 and the cooling unit 303 (FIG. 7).

(Configuration 9)

The imaging apparatus according to any one of configurations 1 to 8, wherein in an optical axis direction Z of the imaging apparatus, a top surface of the flexible substrate 307 is positioned further away from a back surface of the imaging substrate 305 than a top surface of the heat conduction member 312 (FIGS. 4 and 6A).

(Configuration 10)

The imaging apparatus according to any one of configurations 1 to 9, wherein the first heat conduction sheet 314 and the second heat conduction sheet 701 are comprised of graphite (FIGS. 7 and 8).

(Configuration 11)

An imaging apparatus including:

an imaging sensor 306 configured to capture an image;

an imaging substrate 305 on which the imaging sensor 306 is mounted;

a control substrate 302 on which an electronic element 109 configured to perform imaging processing of the imaging sensor 306 is mounted; and a cooling unit 303, wherein the cooling unit 303 includes a duct 310 thermally connected to the imaging substrate 305 and the control substrate 302, and a fan 131 thermally connected to the duct 310 and configured to generate air flow for cooling the imaging substrate 305 and the control substrate 302, the imaging apparatus including:

a first heat conduction sheet 314 that does not include a signal line and thermally connects the imaging substrate 305 and the cooling unit 303; and a second heat conduction sheet 701 that does not include a signal line and thermally connects the imaging substrate 305 and a metal member 311 placed inside the imaging apparatus and configured to dissipate heat, wherein thermal resistance of the second heat conduction sheet 701 is smaller than thermal resistance of the first heat conduction sheet 314, and wherein with respect to an optical axis direction of the imaging sensor 306, the second heat conduction sheet 701 does not overlap the control substrate 302 and the cooling unit 303 (FIG. 7).

(Configuration 12)

The imaging apparatus according to configuration 11, wherein the imaging substrate 305 and the control substrate 302 are each thermally connected to the duct 310, and wherein an amount of heat generated by the control substrate 302 is greater than an amount of heat generated by the imaging substrate 305.

(Configuration 13)

The imaging apparatus according to configuration 11 or 12, wherein the metal member 311 includes a first region S thermally connected to the duct 310, and a second region R thermally connected to the control substrate 302, wherein the second heat conduction sheet 701 is thermally connected to the metal member 311 in a third region Q different from the first region S and the second region R, wherein the third region Q is thermally connected to the first region S in a first connection portion 311*b*, and the third region Q is thermally connected to the second region R in a second connection portion 311*a*, wherein a cross-sectional area of the first connection portion 311*b* is smaller than a cross-sectional area of the first region S, and wherein a cross-sectional area of the second connection portion 311*a* is smaller than a cross-sectional area of the second region R (FIGS. 7 and 8).

(Configuration 14)

The imaging apparatus according to any one of configurations 11 to 13, wherein the first heat conduction sheet 314 and the second heat conduction sheet 701 are comprised of graphite.

Accordingly, it is possible to provide an imaging apparatus capable of preventing a camera from becoming large while a cooling unit composed of a fan and a duct is provided in the imaging apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-178799, filed Oct. 17, 2023, which is hereby incorporated by reference herein in its entirety.

What is claimed is:

1. An imaging apparatus comprising:

an imaging sensor configured to capture an image;

an imaging substrate on which the imaging sensor is mounted;

a control substrate on which an electronic element configured to perform imaging processing of the imaging sensor is mounted; and a cooling unit, wherein the cooling unit includes a duct thermally connected to the imaging substrate and the control substrate, and a fan thermally connected to the duct and configured to generate air flow for cooling the imaging substrate and the control substrate, and wherein, with respect to an optical axis direction of the imaging sensor, the imaging substrate, the control substrate, and the cooling unit do not overlap each other, and wherein the imaging substrate, the control substrate, and the cooling unit are placed in order along a long-side direction of an outermost shape of an exterior cover of the imaging apparatus.

2. The imaging apparatus according to claim 1, wherein the imaging substrate, the control substrate, and the cooling unit are positioned inside the exterior cover of the imaging apparatus, without protruding from the outermost shape of the exterior cover.

3. The imaging apparatus according to claim 2, wherein, with respect to the optical axis direction of the imaging sensor, an upper end of the cooling unit is placed above upper ends of the imaging substrate and the control substrate.

4. The imaging apparatus according to claim 1, wherein the imaging substrate and the control substrate are thermally connected to the duct by contacting at least one heat conduction member.

5. The imaging apparatus according to claim 4, wherein, with respect to the optical axis direction of the imaging sensor, the heat conduction member includes a first portion overlapping the imaging substrate in the optical axis direction of the imaging sensor, and a second portion that does not overlap the imaging substrate in the optical axis direction of the imaging sensor, and wherein another electronic element mounted on the imaging substrate and a flexible substrate into which a signal line electrically connected to the electronic element is built is placed in the second portion and is not placed in the first portion.

6. The imaging apparatus according to claim 5, wherein the fan is thermally connected to at least one signal transmitter configured to transmit a control signal from the electronic element mounted on the control substrate, and wherein, with respect to the optical axis direction of the imaging sensor, the at least one signal transmitter does not overlap the imaging substrate.

7. The imaging apparatus according to claim 5, further comprising:

a first heat conduction sheet that does not include a signal line and thermally connects the imaging substrate and the cooling unit; and a second heat conduction sheet that does not include a signal line and thermally connects the imaging substrate and a metal member placed inside the imaging apparatus and configured to dissipate heat, wherein thermal resistance of the second heat conduction sheet is smaller than thermal resistance of the first heat conduction sheet, and wherein, with respect to the optical axis direction of the imaging sensor, the second heat conduction sheet does not overlap the control substrate and the cooling unit.

8. The imaging apparatus according to claim 5, wherein, in an optical axis direction of the imaging apparatus, a top surface of the flexible substrate is positioned further away from a back surface of the imaging substrate than a top surface of the heat conduction member.

9. The imaging apparatus according to claim 7, wherein the first heat conduction sheet and the second heat conduction sheet are comprised of graphite.

10. An imaging apparatus comprising:

an imaging sensor configured to capture an image;

an imaging substrate on which the imaging sensor is mounted;

a control substrate on which an electronic element configured to perform imaging processing of the imaging sensor is mounted; and a cooling unit, wherein the cooling unit includes a duct thermally connected to the imaging substrate and the control substrate, and a fan thermally connected to the duct and configured to generate air flow for cooling the imaging substrate and the control substrate, the imaging apparatus comprising:

a first heat conduction sheet that does not include a signal line and thermally connects the imaging substrate and the cooling unit; and a second heat conduction sheet that does not include a signal line and thermally connects the imaging substrate and a metal member placed inside the imaging apparatus and configured to dissipate heat, wherein thermal resistance of the second heat conduction sheet is smaller than thermal resistance of the first heat conduction sheet, and wherein, with respect to an optical axis direction of the imaging sensor, the second heat conduction sheet does not overlap the control substrate and the cooling unit.

11. The imaging apparatus according to claim 10, wherein the imaging substrate and the control substrate are each thermally connected to the duct, and wherein an amount of heat generated by the control substrate is greater than an amount of heat generated by the imaging substrate.

12. The imaging apparatus according to claim 10, wherein the metal member includes a first region thermally connected to the duct, and a second region thermally connected to the control substrate, wherein the second heat conduction sheet is thermally connected to the metal member in a third region different from the first region and the second region, wherein the third region is thermally connected to the first region in a first connection portion, and the third region is thermally connected to the second region in a second connection portion, wherein a cross-sectional area of the first connection portion is smaller than a cross-sectional area of the first region, and wherein a cross-sectional area of the second connection portion is smaller than a cross-sectional area of the second region.

13. The imaging apparatus according to claim 10, wherein the first heat conduction sheet and the second heat conduction sheet are comprised of graphite.

* * * * *